United States Patent [19]
Goff

[11] Patent Number: 5,374,090
[45] Date of Patent: Dec. 20, 1994

[54] CORDLESS VACUUM WAND

[75] Inventor: Gerald L. Goff, Austin, Tex.

[73] Assignee: Advanced Micro Devices, Inc., Sunnyvale, Calif.

[21] Appl. No.: 29,146

[22] Filed: Mar. 10, 1993

[51] Int. Cl.$^5$ ............................................. B66C 1/02
[52] U.S. Cl. .................................... 294/64.1; 29/743; 29/758
[58] Field of Search .................... 294/64.1–64.3; 29/743, 758; 901/40; 116/202, 266, 268, 269; 15/DIG. 1

[56] References Cited
U.S. PATENT DOCUMENTS

| | | | |
|---|---|---|---|
| 4,042,999 | 8/1977 | Triantafyllou | 294/64.1 X |
| 4,527,824 | 7/1985 | Rosenfeld | 294/64.1 |
| 4,618,178 | 10/1986 | Hutson et al. | 294/64.1 |
| 4,687,242 | 8/1987 | Van Rooy | 294/64.1 |
| 4,723,503 | 2/1988 | Yuda | 116/202 X |
| 4,904,012 | 2/1990 | Nishiguchi et al. | 294/64.1 |
| 5,106,139 | 4/1992 | Palmer et al. | 294/64.1 |
| 5,217,273 | 6/1993 | Hendricsen et al. | 294/64.1 |

Primary Examiner—Dean J. Kramer
Attorney, Agent, or Firm—Johnson & Wortley

[57] ABSTRACT

A cordless wand device for grasping objects such as silicon wafers during the manufacture of integrated circuits. The wand device comprises a housing having a hollow interior and a tip for grasping objects. The tip is attached to the housing through a hollow tube, and has a perimeter region contoured to form an airtight seal when placed against the surface of an object to be grasped. The tip also has a recessed interior region having an air inlet therein. The wand device includes a power source and a vacuum pump positioned within the housing. The vacuum pump produces a suction force at the air inlet on the tip. When the tip is placed against the surface of an object, the object is securely grasped due to the suction force exerted thereon by the wand tip. A switch located on the wand may be used to turn the vacuum pump on or off in order to grasp or release the object. Light-emitting diodes of different colors indicate to an operator whether or not the power source is sufficiently charged to generate sufficient suction force to safely grasp the object.

4 Claims, 2 Drawing Sheets

CORDLESS VACUUM WAND

BACKGROUND OF THE INVENTION

1. Field of the Invention

This invention relates to tools for grasping objects, and more particularly, to a cordless vacuum wand used to grasp silicon wafers during the manufacture of integrated circuits.

2. History of the Prior Art

Integrated circuits are manufactured on thin silicon wafers which are circular in shape and range in diameter from four to twelve inches. The wafers undergo many different processes during the overall manufacturing cycle, and each process may be performed by a different machine. It is critically important during the entire cycle that the wafers be kept as clean as possible, and that they be handled as carefully as possible to avoid damaging the integrated circuits thereon. Therefore, wafers must be transported with the utmost care from machine to machine within a clean-room manufacturing facility.

Much of the transporting of wafers during the manufacturing process is performed by automated transporters. Robotic arms remove the wafers from each processing machine and place them in a transportation rack. The rack is moved to the next processing machine where another robotic arm removes the wafers from the rack and places them in the machine. Generally, if all components maintain proper alignment in the wafer-transportation system, the entire cycle can be handled automatically. Sometimes, however, it is necessary for human intervention and, therefore, the manual grasping and transportation of wafers.

The most commonly used means for grasping and transporting wafers is with a vacuum wand. FIG. 1 is an illustration of a cut-away portion of a typical wall-mounted, factory-installation of high vacuum tubing and vacuum wands. High vacuum tubing 10 is installed on a wall 11 between a central vacuum pump (not shown) and the area of the manufacturing facility where wafers are most commonly handled. Individual vacuum lines, known as umbilical cords 12, branch off of the high vacuum tubing 10 every few feet, and are equipped with wands 13 at the ends. Each wand 13 has a switch 14 for turning on the suction of the vacuum, and is equipped with a broad, flat tip 15. The flat tip 15 has a depressed central region 16 where the suction from the vacuum is applied. When the flat tip 15 is placed against the flat surface of a silicon wafer, a partial vacuum is created in the area of the depression 16, and the suction force holds the wafer securely against the tip of the vacuum wand. In this manner, the wafer may be handled with minimal stress applied to the wafer, and without touching the wafer with hands or gloves which could contaminate the integrated circuits thereon. This set-up works acceptably well as long as wafers do not need to be transported beyond the range of the umbilical vacuum cord 12.

A major problem arises, however, when wafers must be carried beyond the range of the umbilical cord 12, or in areas of the manufacturing facility where high vacuum tubing 10 has not been installed. The installation of high vacuum tubing is very expensive, costing approximately $40,000 to $50,000 to install in a new area of a factory. Therefore, high vacuum tubing is generally not run to all areas. In those areas, other means must be utilized to handle wafers.

In the past, one such means has been to use tweezers. Tweezers, however, pose several problems and may potentially damage wafers being handled and the integrated circuits thereon. Tweezers can cause stress fractures in the silicon, depending on how hard the wafer is squeezed. The fractures may not be discernable until much later in the manufacturing process when considerable time and expense has been invested, and faulty integrated circuits are detected. Tweezers may also scratch the wafer or even chip the edge if it is hit with sufficient force. Chipped edges may cause further contamination of the wafer or other wafers from silicon dust which is produced from the break.

It would be a distinct advantage to have a relatively inexpensive device for safely handling wafers in areas of a manufacturing facility which do not have high vacuum tubing installed. The device of the present invention provides such a device.

SUMMARY OF THE INVENTION

In one aspect, the present invention is a cordless apparatus for grasping objects, which comprises a housing having a first air inlet therein. Within the housing is a means for creating a suction force at the first air inlet. The apparatus also includes a means for applying the suction force to a surface of an object to be grasped, which may be with a contoured tip. The means for creating a suction force may include a vacuum pump and a power source which is electrically connected to the vacuum pump. A vacuum extension line relays the suction force from the first air inlet in the housing to a second air inlet in the tip. The apparatus may also include a means for indicating to an operator whether the suction force generated by the vacuum pump is of sufficient strength to grasp the object.

In another aspect, the present invention is a method of grasping objects with a cordless apparatus. The method begins by providing a cordless housing having a first air inlet therein. Then, created within said housing, is a suction force which is exerted at the first air inlet. This is followed by applying the suction force to a surface of an object to be grasped. The step of creating a suction force may include mounting a vacuum pump within the housing and electrically connecting a power source to the vacuum pump.

In still another sense, the present invention is a cordless wand device for grasping objects. The wand device comprises a housing having a hollow interior and a tip for grasping objects. The tip is attached to the housing, and has a perimeter region contoured to form an airtight seal when placed against a surface of an object to be grasped. The tip also has a recessed interior region having a first air inlet therein. The wand device also includes a power source, having a positive pole and a negative pole, positioned within the housing. A vacuum pump for producing a suction force at a second air inlet is also positioned within the housing and is electrically connected to a switch. The switch is also electrically connected to the positive pole of the power source, whereby when the switch is closed, the vacuum pump is activated. A vacuum extension line disposed within the housing comprises a hollow tube having a first and second end. The first end of the tube is attached to the second air inlet, and the second end extends through an aperture in a surface of the housing and connects to the first air inlet in the tip of the wand device.

BRIEF DESCRIPTION OF THE DRAWING

The invention will be better understood and its numerous objects and advantages will become more apparent to those skilled in the art by reference to the following drawing, in conjunction with the accompanying specification, in which.

DETAILED DESCRIPTION

Figure 1:
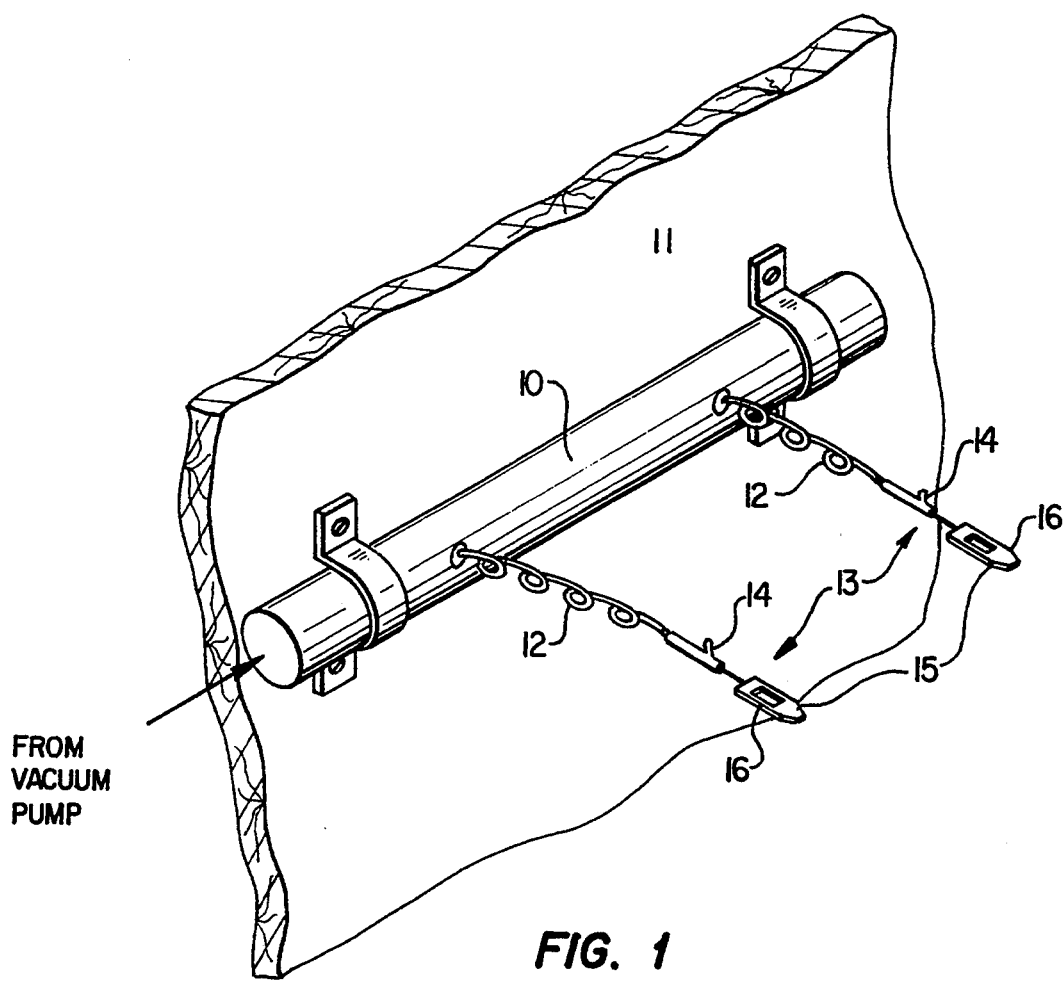
FIG. 1 (Prior art) is an illustration of a cut-away portion of a typical wall-mounted installation of high vacuum tubing and vacuum wands in a manufacturing facility.
Figure 2:
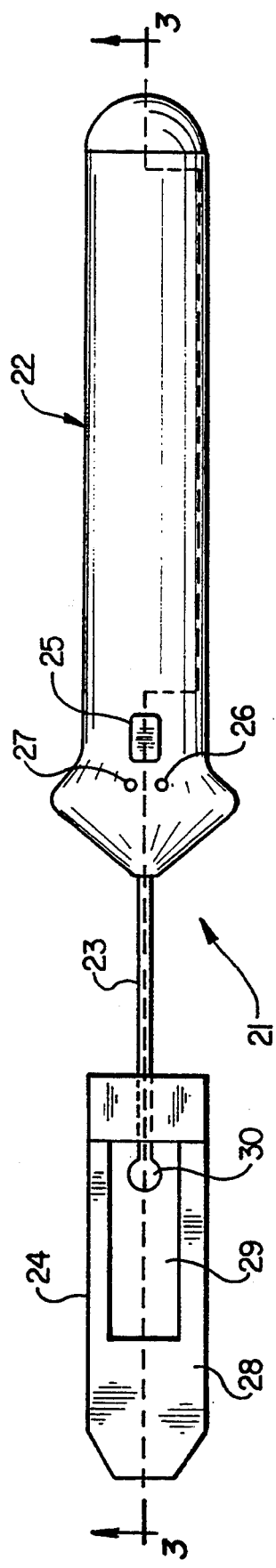
FIG. 2 is a top side view of the preferred embodiment of a cordless vacuum wand constructed in accordance with the teachings of the present invention.

FIG. 2 is a top side view of the preferred embodiment of a cordless vacuum wand 21 constructed in accordance with the teachings Of the present invention. The wand 21 comprises a housing 22, a vacuum extension line 23, and a tip 24. The housing 22 may be constructed of any hard plastic material which is not electrically conductive, and is resistant to breakage in case the wand 21 is dropped. The vacuum extension line 23 may be stainless steel tubing. For grasping flat silicon wafers, the wand tip 24 may be a commercially available angular wand tip or a straight wand tip, and is constructed in the same manner as is known in the art for factory-installed vacuum wand tips 16 (FIG. 1). For applications other than carrying flat silicon wafers, the tip may be constructed with a perimeter region 28 which may be contoured to match the shape of the surface of the article to be grasped, thereby forming an airtight seal when placed in contact therewith. An interior region 29 is recessed below the level of the perimeter region 28, and has an aperture the inlet 30.

Mounted on the housing 22 is a switch 25 which, when depressed, actuates the operation of the cordless vacuum wand 21, as described in more detail below. A green light-emitting diode (L.E.D.) 26 illuminates when the switch 25 is depressed and the wand 21 is capable of generating sufficient suction force to safely grasp a wafer. A red L.E.D. 27 illuminates when the switch 25 is depressed and the wand 21 cannot generate sufficient vacuum pressure. This capability is described in more detail in conjunction with FIG. 4 below.

Figure 3:
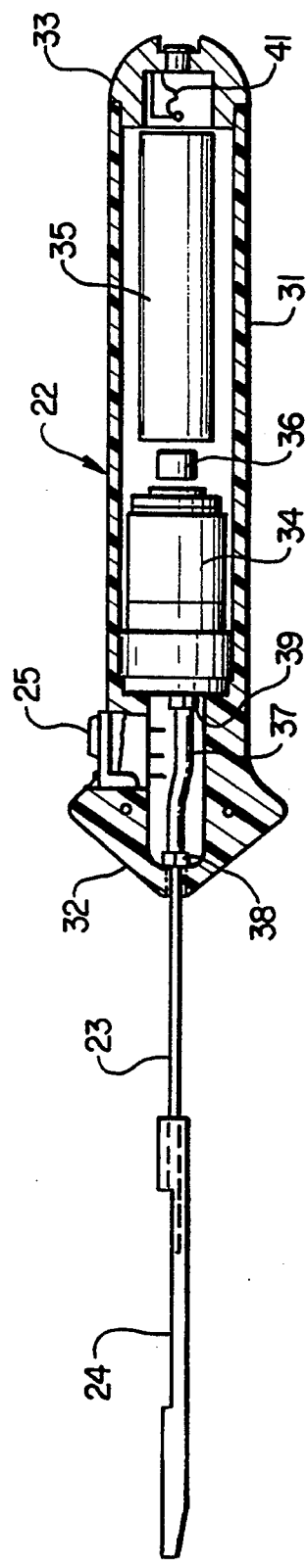
FIG. 3 is a side elevational view of the cordless vacuum wand of FIG. 2 with a partial cross section taken along line 3—3 of FIG. 2.

FIG. 3 is a side elevational view of the cordless vacuum wand 21 with a partial cross section taken along line 3—3 of FIG. 2. In this view it can be seen that the housing 22 is hollow, and comprises a tubular shaft section 31 having a front portion 32, and an end cap 33. Mounted within the shaft section 31 is a vacuum pump 34, a power source 35, and an integrated circuit 36. The vacuum pump 34 may be, for example, a 3-volt, direct-current, rotary-vane vacuum pump such as a model G01 available from ASF Corporation. The power source 35 may be a 5-volt NiCad rechargeable battery. The integrated circuit 36 may be, for example, a model ICL8211 available from Harris Corporation.

When fully charged, the battery 35 will drive the vacuum pump 34 at sufficient speed to pull a vacuum of approximately 8-12 inches of water. The pump 34 provides sufficient suction force to safely grasp a silicon wafer whenever the charge on the battery 35 exceeds four volts.

Mounted within the front section 32 of the housing 2 is a vinyl hose 37 which is connected at one end to the vacuum pump 34 and at the other end to the stainless steel vacuum extension line 23. The vinyl hose 37 may be connected at each end by means of standard ⅛-inch hose fittings 38 and 39.

Mounted within the end cap 33 is an industry-standard receptacle 41 for a battery recharger (not shown).

Figure 4:
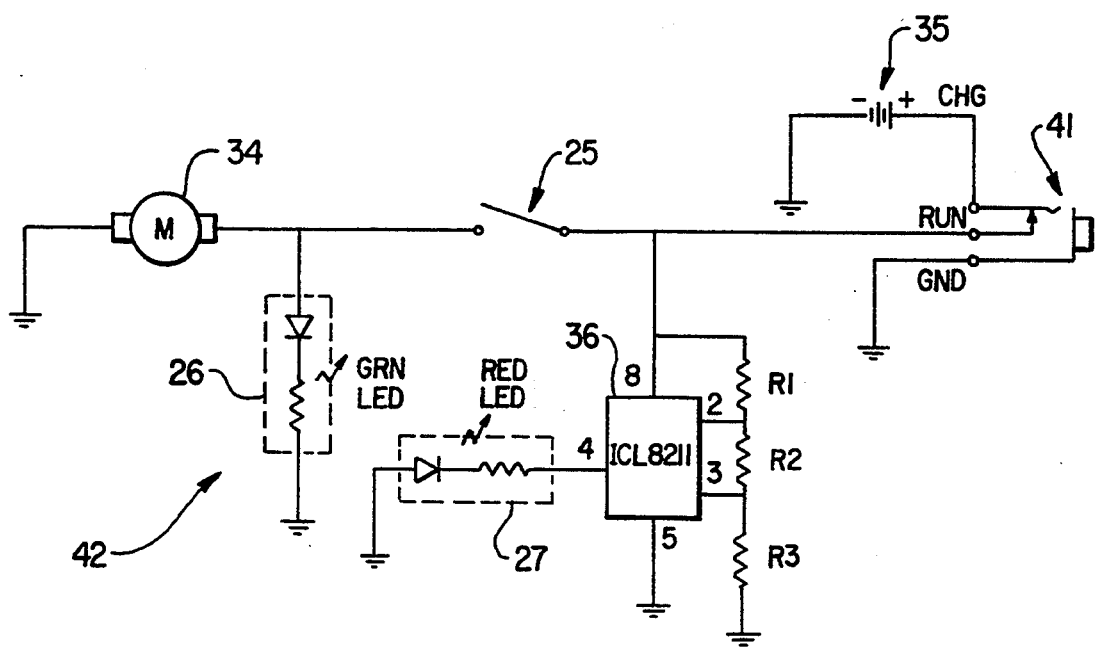
FIG. 4 is a schematic diagram of an electrical control and battery recharging circuit in the preferred embodiment of the cordless vacuum wand of the present invention.

FIG. 4 is a schematic diagram of an electrical control and battery recharging circuit 42 in the preferred embodiment of the cordless vacuum wand 21 of the present invention. The control circuit 42 provides instantaneous power to the vacuum pump 34 when the switch 25 is depressed. Simultaneously, the circuit 42 provides the operator of the vacuum wand with an indication of whether the wand 21 is capable of pulling sufficient vacuum to safely grasp a wafer. As noted above, the status of the wand is communicated to the operator via the green and red L.E.D. 26 and 27 on the wand housing 22. The green L.E.D. 26 illuminates when the battery 35 has sufficient charge remaining (over four volts ) to pull sufficient vacuum pressure. The red L.E.D. 27 illuminates when the battery 35 does not have sufficient charge remaining.

In the preferred embodiment, the series resistors R1, R2, and R3 are each ⅛-Ohm resistors. The integrated circuit 36 detects the voltage drop across each resistor and turns on the red L.E.D. 27 when the total voltage drop indicates that the charge on the battery 35 has dropped below four volts. Other sizes of resistors R1, R2, and R3 could, of course, be utilized if a different threshold voltage is desired.

It is thus believed that the operation and construction of the present invention will be apparent from the foregoing description. While the method, apparatus and system shown and described has been characterized as being preferred, it will be readily apparent that various changes and modifications could be made therein without departing from the spirit and scope of the invention as defined in the following claims.

What is claimed is:

1. A cordless apparatus for grasping objects said apparatus comprising:
   a cordless housing having a first air inlet therein;
   means within said housing for creating a suction force at said first air inlet;
   means for applying said suction force to a surface of object to be grasped; and
   means for indicating to an operator whether said suction force is of sufficient strength to grasp said object, said indicating means comprising:
   a first light-emitting diode which illuminates when said means for creating a suction force is activated and said suction force is of sufficient strength to grasp said object;
   a second light-emitting diode which illuminates when said means for creating a suction force is activated and said suction force is not of sufficient strength to grasp said object; and
   means for determining the sufficiency of said suction force.

2. The apparatus of claim 1 wherein the means for determining the sufficiency of said suction force includes:

a power source disposed within said apparatus, said power source having a positive pole and a negative pole;

a first resistor electrically connected between said positive pole of said power source and electrical ground;

a second resistor connected in series with said first resistor;

a third resistor connected in series with said first and second resistors; and an integrated circuit connected in parallel with said first, second, and third resistors, said integrated circuit detecting the voltage drop across each of said resistors, and causing said first light-emitting diode to illuminate when the total voltage drop exceeds a predetermined threshold, and causing said second light-emitting diode to illuminate when said total voltage drop is less than said predetermined threshold.

3. A cordless wand device for grasping objects, said wand device comprising:

a housing having a hollow interior:

a tip for grasping objects, said tip being attached to said housing, and said tip having;

a perimeter region contoured to form an airtight seal when placed against a surface of said object to be grasped; and a recessed interior region having a first air inlet therein;

a power source positioned within said housing, said power source having a positive pole and a negative pole;

a switch mounted on said housing;

a vacuum pump for producing a suction force at a second air inlet, said vacuum pump positioned within said housing and electrically connected to said switch:

said switch being electrically connected to said positive pole of said power source, whereby when said switch is closed, said vacuum pump is activated;

a vacuum extension line disposed within said housing, said vacuum line comprising a hollow tube having a first and second end, the first end of said tube being attached to said second air inlet, and said second end extending through an aperture in a surface of said housing and connecting to said first air inlet of said tip of said wand device; and means for indicating to an operator whether said suction force is of sufficient strength to grasp said object, said indicating means comprising:

a first light-emitting diode which illuminates when said switch is closed and said suction force is of sufficient strength to grasp said object;

a second light-emitting diode which illuminates when said switch is closed and said suction force is not of sufficient strength to grasp said object; and means for determining the sufficiency of said suction force.

4. The cordless wand device of claim 3 wherein the means for determining the sufficiency of said suction force includes:

a first resistor electrically connected between said positive pole of said power source and electrical ground;

a second resistor connected in series with said first resistor;

a third resistor connected in series with said first and second resistors; and an integrated circuit connected in parallel with said first, second, and third resistors, said integrated circuit detecting the voltage drop across each of said resistors, and causing said first light-emitting diode to illuminate when the total voltage drop exceeds a predetermined threshold, and causing said second light-emitting diode to illuminate when said total voltage drop is less than said predetermined threshold.

* * * * *